United States Patent [19]

Zierhut

[11] Patent Number: 5,459,429

[45] Date of Patent: Oct. 17, 1995

[54] DRIVE FOR A SYMMETRICAL BIPOLAR TRANSISTOR

[75] Inventor: Hermann Zierhut, Munich, Germany

[73] Assignee: Siemens Aktiengesellschaft, Munich, Germany

[21] Appl. No.: 374,536

[22] PCT Filed: Jul. 8, 1993

[86] PCT No.: PCT/DE93/00605

§ 371 Date: Jan. 17, 1995

§ 102(e) Date: Jan. 17, 1995

[87] PCT Pub. No.: WO94/03975

PCT Pub. Date: Feb. 17, 1994

[30] Foreign Application Priority Data

Jul. 31, 1992 [DE] Germany ............... 42 25 455.8

[51] Int. Cl.$^6$ .................................. H03K 17/56
[52] U.S. Cl. .................................. 327/425; 327/66
[58] Field of Search .................. 326/89, 90; 327/425, 327/52, 53, 54, 65, 66, 67; 330/257, 288

[56] References Cited

U.S. PATENT DOCUMENTS 3,207,927  9/1965  Wells ............................ 307/88.5
4,096,399  6/1978  Davis et al. ..................... 327/425

FOREIGN PATENT DOCUMENTS

| 0487759 | 6/1991 | European Pat. Off. . |
| 1185223 | 9/1961 | Germany . |
| 2333191 | 9/1974 | Germany . |
| 812785 | 3/1978 | Germany . |
| 3715238 | 5/1987 | Germany . |
| 4316608 | 6/1993 | Germany . |

OTHER PUBLICATIONS

Sziklai, "Symmetrical Properties of Transistors And Their Applications" pp. 717–724 Proceedings of the I.R.E. Jun. 1953.

Primary Examiner—Timothy P. Callahan
Assistant Examiner—Jeffrey Zweizig
Attorney, Agent, or Firm—Kenyon & Kenyon

[57] ABSTRACT

A drive circuit for triggering a symmetrical bipolar transistor, the drive circuit having a balanced circuit connected to two operating electrodes of the symmetrical bipolar transistor. The balanced circuit includes two parts connected by their bases. Collectors of the two parts of the balanced circuit act on inverse balanced circuits which control a switching device which in turn controls the triggering of the symmetrical bipolar transistor.

6 Claims, 3 Drawing Sheets

DRIVE FOR A SYMMETRICAL BIPOLAR TRANSISTOR

BACKGROUND OF THE INVENTION

Symmetrical bipolar transistors have many applications. In a known application, a bipolar transistor is used as a reverse-polarity protection element in a coupling circuit to a bus system. (See European Patent Publication No. EP-A-0487 759, FIG. 3.) Such reverse-polarity protection is preferably suitable for assemblies in bus systems, in computers and in controllers with a storage capability. The reverse-polarity protection element is located in a signal coupling path and serves as a controllable element which switches the signal coupling path on and off as a function of the polarity of an electrical signal. The known bipolar transistor is designed as a double-emitter transistor whose emitter current can be controlled uniformly in both directions.

A bipolar transistor structure is also generally suitable for checking whether a potential difference is less than a specific value and thus, in addition, whether a voltage is approaching another voltage. Until now, comparators have been used for such applications. The required comparator arrangements are normally rather complex, however. A national German application having an older priority (German Patent Application No. DE-A-43 16 608) discusses a bipolar transistor structure.

If a bipolar transistor structure is intended to be integrated in an integrated circuit, it is desirable to minimize the power losses which occur and to keep the currents for driving such bipolar transistor structures correspondingly low. The object of the present invention is to find a driver circuit for a symmetrical bipolar transistor and for a bipolar transistor structure in an IC circuit, which operates with drive currents which are as low as possible.

SUMMARY OF THE INVENTION

The above mentioned object is achieved by providing an improved driver circuit for controlling a symmetrical bipolar transistor, or for controlling a symmetrical bipolar transistor structure, having two operating electrodes. The driver circuit includes a pair of balanced circuits, a pair of inverse balanced circuits and a switch. The pair of balanced circuits is coupled with the two operating electrodes, are coupled to one another by their bases, and have a reference current supplied to their bases. The pair of inverse balanced circuits are acted upon by collectors of the pair of balanced circuits. The switch is controlled by the pair of inverse balanced circuits and has an open state and a closed state in which a triggering current flows to the base of the symmetrical bipolar transistor. The switch is in the open state when the two operating electrodes of the symmetrical bipolar transistor are at the same potential.

A balanced circuit of a type which is known per se is connected to the two operating electrodes of the symmetrical bipolar transistor or of the symmetrical bipolar transistor structure. The balanced circuit can preferably be connected with the operating electrode by means of its emitter. In this case, the bases of the two balanced circuits are connected to one another, and the collectors of the two balanced circuits act on inverse balanced circuits. The inverse balanced circuits regulate the control current required to control the bipolar transistor. In such an arrangement, using low drive currents for the symmetrical bipolar transistor or the symmetrical bipolar transistor structure is possible. Both arrangements are called bipolar transistors, for short, in the following text.

The balanced circuits can each be extended, as first balanced circuits, by a second amplifying balanced circuit. The second balanced circuits are each connected to a collector of the first balanced circuit. Such an arrangement permits current pulses having a very high edge gradient to be sent via the bipolar transistor.

In a preferred embodiment of the present invention, the second, amplifying balanced circuits are connected, via coupled ENABLE switches, to the first balanced circuits. In each case, the collectors of the first balanced circuits in this case act on one amplifying balanced circuit via the ENABLE switches. One amplifying balanced circuit is, in each case, connected directly to a collector of a first balanced circuit, possibly with the intermediate connection of an ENABLE switch. Such a driver circuit operates at very high speed, with a control delay of only a few hundred ns. As a result of the increased current consumption, it is, however, favorable to connect the amplifying balanced circuits via the ENABLE switches only in the case of transmission.

BRIEF DESCRIPTION OF THE DRAWINGS

The invention is now intended to be explained in more detail with reference to exemplary embodiments which are illustrated in the drawing.

DETAILED DESCRIPTION

Figure 1:
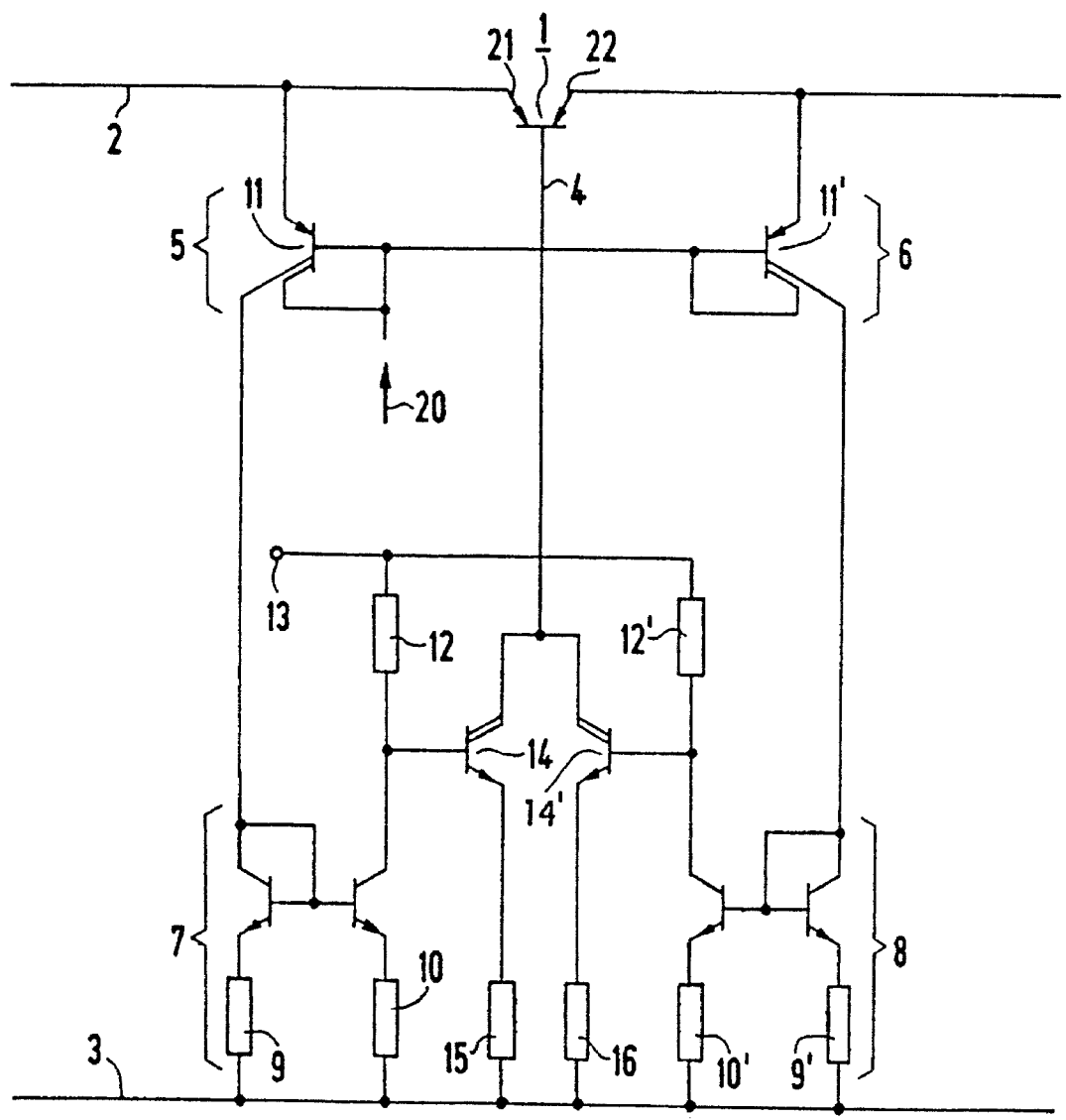
FIG. 1 is a schematic which shows a bipolar transistor driven by a driver circuit having a balanced circuit and a downstream inverse balanced circuit.

The bipolar transistor 1 according to FIG. 1 is designed as a double-emitter transistor. It is connected in a line 2 of a conductor arrangement, composed of the lines 2 and 3, by means of its operating electrodes, the emitter electrodes. One connection 4 leads to the base of the bipolar transistor. First balanced circuits 5 and 6 are, in each case, connected to the emitters of the bipolar transistor 1. The bases of these balanced circuits 5 and 6 are connected to one another. One collector 11, 11', in each case, of the first balanced circuits 5 and 6, respectively, controls an inverse balanced circuit 7 or 8, respectively. The resistors 9, 9' and, if required, the resistors 10, 10' may be provided to modify the transmission characteristics, in the case of an adjustable mirror characteristic, such as those provided based on the IC surfaces of the balanced circuits.

The outputs of the inverse balanced circuits are connected to a resistors 12, 12'. The resistors 12, 12' are supplied from a constant-voltage source 13 with respect to ground. The outputs of the inverse balanced circuits 7 and 8 furthermore act on, in each case, one base of a transistor 14, 14' for example in a DARLINGTON circuit. The transistors 14, 14' are connected by means of their collectors to the base as the control electrode of the bipolar transistor 1. The resistors 15 and 16 are used for linearizing and current limiting.

Figure 2:
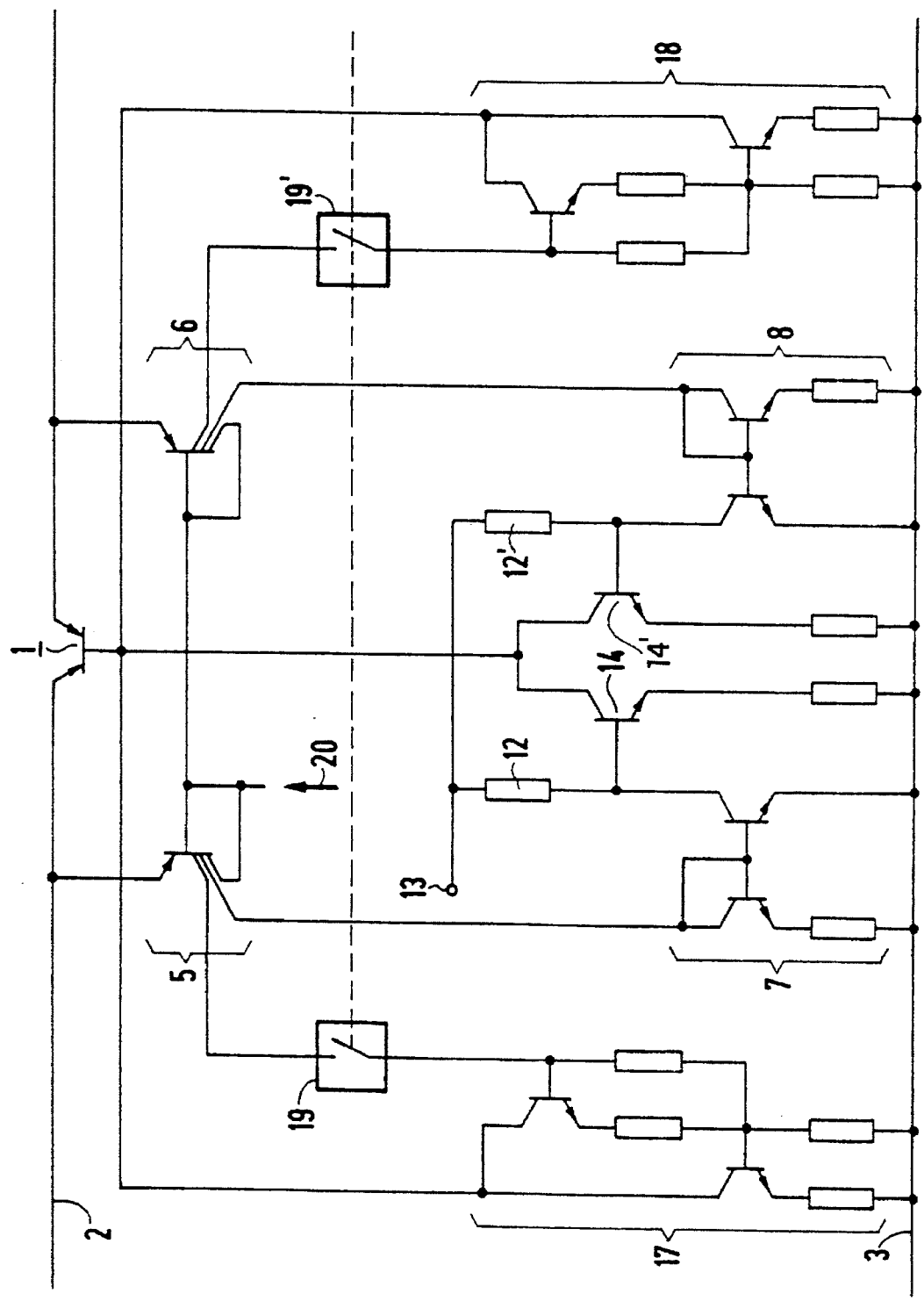
FIG. 2 is a schematic which shows a bipolar transistor driven by a driver circuit having two sets of balanced circuits according to FIG. 1 and, in each case, one amplifying second balanced circuit.

In the design according to FIG. 2, second amplifying balanced circuits 17 and 18 are, in each case, connected, via ENABLE switches 19, 19', in principle to a circuit arrangement according to FIG. 1. The ENABLE switches 19, 19' are, in each case, connected to a further collector of the first balanced circuit 5 or 6, respectively. A reference voltage is connected again as a constant voltage source 13, and a reference current source 20 again supplies the first balanced circuits 5 and 6.

The circuit according to FIG. 1 operates as follows:

The excitation current 20 from a constant current source is split between the balanced circuit formed by the first balanced circuits 5 and 6, depending on whether the operating electrode 21 or the operating electrode 22 of the bipolar transistor 1 is at a more positive potential. If the potential on the operating electrode 21 is more positive than that on the operating electrode 22, then the first balanced circuit 5 draws more current than the other first balanced circuit 6. However, if the potential on the operating electrode 22 is more positive than that on the operating electrode 21, then the first balanced circuit 6 draws more current that the other first balanced circuit 5.

If the bipolar transistor 1 is fully saturated, in which case the potentials on the operating electrodes 21 and 22 are equal, the excitation current 20 is split uniformly between the first balanced circuits 5 and 6. The balanced circuit is then in balance. In this case, the two inverse balanced circuits 7 and 8 draw the same current. The resistors 12, 12' are dimensioned such that the same voltage drop occurs on each in the indicated state. This voltage drop corresponds to, or is equal to, the voltage from the constant voltage source 13. As a consequence, the bases of the transistors 14, 14', which are shown in the exemplary embodiment as DARLINGTON transistors, are effectively connected to ground (or 0 V). Accordingly, no current can flow in the collectors of the transistors 14, 14' from the control electrode of the bipolar transistor 1, via the connection 4.

The drive current does not rise until the balance formed by the first balanced circuits 5 and 6 is no longer in balance. The operating electrode 21 or 22 becomes more negative depending on the direction of a current via the bipolar transistor 1, so that one of the two transistors 14, 14' receives a positive drive and, as a consequence, supplies the required drive current to the bipolar transistor 1.

In the circuit arrangement according to FIG. 2, the collectors of the first balanced circuits 5 and 6 respectively, which are passed via ENABLE switches 19, 19', act on, in each case, one amplifying balanced circuit 17 or 18, respectively. This additional drive operates at a very high speed, with a control delay of a few hundred ns, for example. The fact that the amplifying second balanced circuits 17 and 18 intrinsically have a greater current consumption can be corrected by the ENABLE switches 19, 19'. It is favorable to carry out the connection via the ENABLE switches 19, 19' only in the event of transmission.

Figure 3:
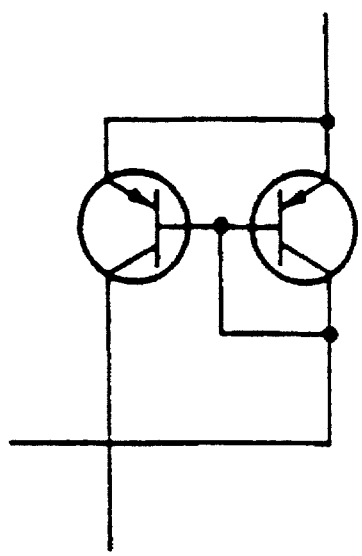
FIG. 3 is a schematic which shows another circuit diagram for an individual balanced circuit arrangement.
Figure 4:
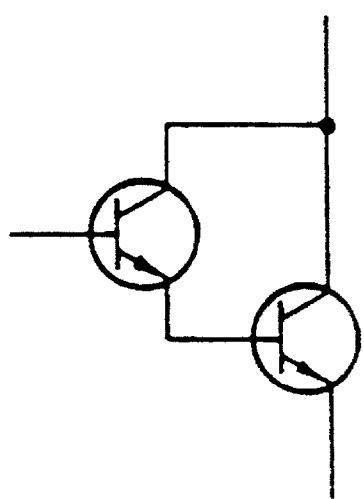
FIG. 4 is a schematic which shows the classic illustration of a DARLINGTON circuit for transistors.

FIG. 3 shows another illustration of the first balanced circuits 5 and 6 respectively. This illustration was more common in the past. FIG. 4 shows a classic illustration of the transistors 14, 14' which are shown in FIG. 1, for example, as DARLINGTON transistors.

I claim:

1. A driver circuit for controlling a symmetrical bipolar transistor, or for controlling a symmetrical bipolar transistor structure, having two operating electrodes, the driver circuit comprising:

a) a pair of balanced circuits coupled with the two operating electrodes, the pair of balanced circuits being coupled to one another by their bases and having a reference current supplied to their bases;

b) a pair of inverse balanced circuits, the pair of inverse balanced circuits being acted upon by collectors of the pair of balanced circuits; and c) a switch, the switch being driven by the pair of inverse balanced circuits and having an open state and a closed state in which a triggering current flows to the base of the symmetrical bipolar transistor, wherein the switch is in the open state when the two operating electrodes of the symmetrical bipolar transistor are at the same potential.

2. The drive circuit of claim 1 further comprising a pair of amplifying balanced circuits, each of the pair of amplifying balanced circuits being coupled with a further collector of a respective one of the pair of balanced circuits.

3. The drive circuit of claim 2 wherein the pair of amplifying balanced circuits are coupled, via enable switches, to the balanced circuits.

4. A circuit for triggering a symmetrical bipolar transistor having two operating electrodes and a base electrode, the circuit comprising:

a) a first balanced circuit, the first balanced circuit having
  i) a first part having an emitter coupled with one of the two operating electrodes of the symmetrical bipolar transistor, a base, and at least one collector, and
  ii) a second part having an emitter coupled with an other of the two operating electrodes of the symmetrical bipolar transistor, a base coupled with the base of the first part of the first balanced circuit and coupled with a reference current source, and at least one collector;

b) an inverse balanced circuit, the inverse balanced circuit having
  i) a first part having a control input coupled with one of the at least one collector of the first part of the first balanced circuit and having an output, and
  ii) a second part having a control input coupled with one of the at least one collector of the second part of the first balanced circuit and having an output; and c) a switching device for controllably switching through a triggering current to the base of the symmetrical bipolar transistor, the switching device having
  i) a first part having an emitter coupled with a triggering current source, a collector coupled with the base of the symmetrical bipolar transistor, and a base coupled with the output of the first part of the inverse balanced circuit and coupled with a reference voltage, and
  ii) a second part having an emitter coupled with a triggering current source, a collector coupled with the base of the symmetrical bipolar transistor, and a base coupled with the output of the second part of the inverse balanced circuit and coupled with the referenced voltage, whereby, the first and second parts of the switching device remain open when the two operating electrodes of the symmetrical bipolar transistor are at the same potential.

5. The circuit of claim 4 further comprising:

d) an amplifying balanced circuit having
  i) a first part having an input coupled with another of the at least one collector of the first part of the first balanced circuit, and having an output coupled with the base of the symmetrical bipolar transistor, and
  ii) a second part having an input coupled with another of the at least one collector of the second part of the first balanced circuit, and having an output coupled with the base of the symmetrical bipolar transistor.

6. The circuit of claim 5 further comprising:

e) an enable switch arranged between the another of the at least one collector of the first part of the first balanced circuit and the input of the first part of the amplifying balanced circuit; and f) an enable switch arranged between the another of the at least one collector of the second part of the first balanced circuit and the input of the second part of the amplifying balanced circuit.

* * * * *